United States Patent
Darvishi et al.

(10) Patent No.: US 12,206,362 B2
(45) Date of Patent: Jan. 21, 2025

(54) RADIO-FREQUENCY MIXER WITH STABILIZED BIASING

(71) Applicant: Apple Inc., Cupertino, CA (US)

(72) Inventors: Milad Darvishi, San Diego, CA (US); Haowei Jiang, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/336,761

(22) Filed: Jun. 16, 2023

(65) Prior Publication Data

US 2024/0421768 A1    Dec. 19, 2024

(51) Int. Cl.
*H03D 7/12* (2006.01)
*H03D 7/14* (2006.01)

(52) U.S. Cl.
CPC ............... *H03D 7/125* (2013.01); *H03D 7/14* (2013.01)

(58) Field of Classification Search
CPC ............ H03D 7/12; H03D 7/125; H03D 7/14; H03D 7/1425; H03D 7/1441; H03D 7/1458; H03D 7/1475; H03D 7/1491
See application file for complete search history.

(56) References Cited

U.S. PATENT DOCUMENTS

| | | | |
|---|---|---|---|
| 6,529,721 B1 | 3/2003 | Tiller | |
| 7,065,327 B1 | 6/2006 | Macnally et al. | |
| 7,509,111 B2 | 3/2009 | Langenberg et al. | |
| 7,750,749 B2 | 7/2010 | Jones | |
| 8,351,891 B2 | 1/2013 | Heydari et al. | |
| 8,378,732 B2 | 2/2013 | Kousai et al. | |
| 8,412,143 B2* | 4/2013 | Wang | H03D 7/1458 455/323 |
| 8,901,988 B2 | 12/2014 | Stroet | |
| 10,236,826 B1 | 3/2019 | Darwhekar et al. | |
| 11,277,108 B1 | 3/2022 | Ibrahim et al. | |
| 11,349,465 B2 | 5/2022 | Chakraborty | |
| 2016/0197761 A1 | 7/2016 | Chang et al. | |
| 2022/0200553 A1 | 6/2022 | Sakakida | |

* cited by examiner

*Primary Examiner* — Long Nguyen
(74) *Attorney, Agent, or Firm* — Treyz Law Group; Jason Tsai (57) ABSTRACT

An electronic device may include wireless circuitry having a radio-frequency mixer. The mixer may include a first pair of mixer transistors configured to receive an oscillating signal, a second pair of mixer transistors configured to receive the oscillating signal, and a bias circuit configured to receive the oscillating signal and to generate a corresponding output voltage for controlling an amount of current flowing through the first and second pairs of mixer transistors. The bias circuit can be configured as a replica envelope detection circuit. The bias circuit can include a pair of bias transistors coupled to a tail transistor that receives the output voltage of the replica envelope detection circuit.

20 Claims, 7 Drawing Sheets

RADIO-FREQUENCY MIXER WITH STABILIZED BIASING

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless communications circuitry in the wireless communications circuitry uses the antennas to receive and transmit radio-frequency signals.

The wireless communications circuitry can include a transceiver having one or more mixers. A mixer in the transmit path can be used to modulate signals from a baseband frequency to a radio frequency, whereas a mixer in the receive path can be used to demodulate signals from the radio-frequency to the baseband frequency. Mixers receive clock signals generated from local oscillator circuitry. It can be challenging to design satisfactory mixers for an electronic device.

SUMMARY

An electronic device may include wireless circuitry. The wireless circuitry may include one or more mixers that receive an oscillating signal. The mixer can be a radio-frequency transmitting mixer or a radio-frequency receiving mixer. A local oscillator can generate the oscillating signal. The mixer can be a transformer based mixer exhibiting improved linearity.

An aspect of the disclosure provides mixer circuitry that includes a first mixer transistor configured to receive a first oscillating signal, a second mixer transistor configured to receive a second oscillating signal different than the first oscillating signal, a first bias transistor configured to receive the first oscillating signal and having a drain terminal, and a second bias transistor configured to receive the second oscillating signal and having a drain terminal coupled to the drain terminal of the first bias transistor. The mixer circuitry can further include a third mixer transistor configured to receive the first oscillating signal and a fourth mixer transistor configured to receive the second oscillating signal. The first mixer transistor can have a source terminal coupled to a first tail node, and the second mixer transistor can have a source terminal coupled to the first tail node. The third mixer transistor can have a source terminal coupled to a second tail node, and the fourth mixer transistor can have a source terminal coupled to the second tail node. The mixer circuitry can further include a tail transistor having a drain terminal coupled to a source terminal of the first bias transistor and to a source terminal of the second bias transistor, an operational amplifier having a first input configured to receive a reference voltage, a second input coupled to the drain terminal of the first bias transistor, and an output coupled to a gate terminal of the tail transistor. The mixer circuitry can further include a third bias transistor having a gate terminal coupled to a gate terminal of the tail transistor and having a drain terminal coupled to a center tap terminal of the secondary coil, a filter circuit coupled directly to the gate terminal of the tail transistor, and a current source coupled to the drain terminals of the first and second bias transistors.

An aspect of the disclosure provides mixer circuitry that includes a first pair of mixer transistors configured to receive an oscillating signal, a second pair of mixer transistors configured to receive the oscillating signal, and a bias circuit configured to receive the oscillating signal and to generate a corresponding output voltage for controlling an amount of current flowing through the first and second pairs of mixer transistors. The mixer circuitry can further include a first input transistor coupled to the first pair of mixer transistors at a first tail node, a second input transistor coupled to the second pair of mixer transistors at a second tail node, a pair of bias transistors coupled together in parallel and configured to receive the oscillating signal, a current source coupled to drain terminals of the pair of bias transistors, and a tail transistor coupled to source terminals of the pair of bias transistors. The bias circuit can include an operational amplifier having a first input configured to receive a reference voltage, a second input coupled to the drain terminal of the pair of bias transistors, and an output coupled to a gate terminal of the tail transistor.

An aspect of the disclosure provides mixer circuitry that includes first and second mixer transistors configured to receive a differential oscillating signal, third and fourth mixer transistors configured to receive the differential oscillating signal, and an envelope detection circuit configured to receive the differential oscillating signal and to generate an output voltage for controlling an amount of current flowing through at least the first and second mixer transistors. The envelope detection circuit can include first and second bias transistors coupled in parallel and a tail transistor having a source-drain terminal coupled to the first and second bias transistors and having a gate terminal configured to receive the output voltage of the envelope detection circuit.

DETAILED DESCRIPTION

Figure 1:
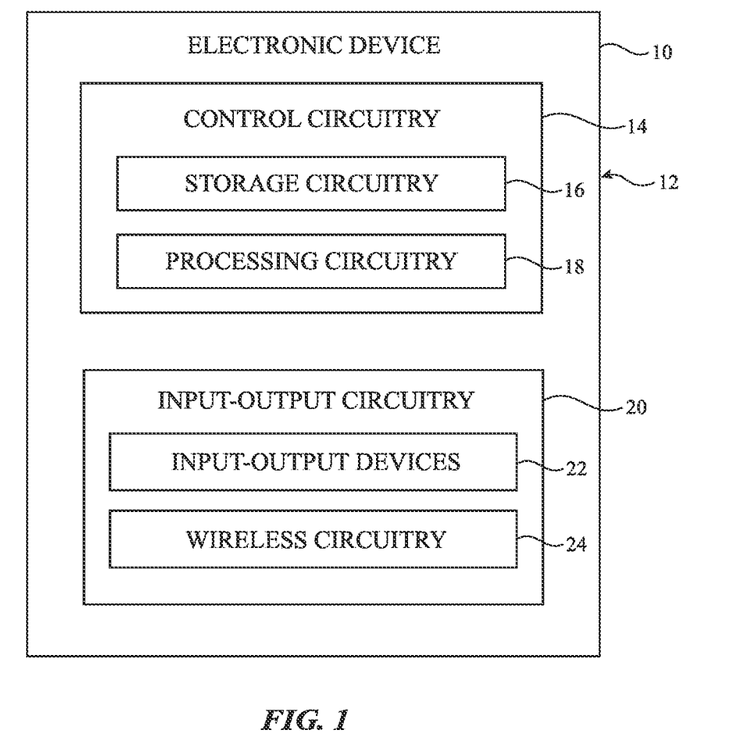
FIG. 1 is a diagram of an illustrative electronic device having wireless circuitry in accordance with some embodiments.

An electronic device such as electronic device 10 of FIG. 1 may be provided with wireless circuitry. The wireless circuitry can include mixers. State of the art radio-frequency (RF) mixers can include minimum channel-length transistors. Conventional biasing schemes for minimum channel-length transistors can be sensitive to drain-to-source voltage (Vds) variation and channel-length modulation. In such scenarios, process/voltage/temperature (PVT) variations can lead to bias current variation in the RF mixer, which can degrade the gain, noise figure, and linearity of the mixer.

A mixer can include a first transistor pair configured to receive a differential local oscillator (LO) signal and a second transistor pair also configured to receive the differential LO signal. The first transistor pair has a first direct current (DC) current that flows through a first tail transistor, whereas the second transistor pair has a second DC current that flows through a second tail transistor. The DC level of the Vds of the first and second tail transistors can be a function of the large-signal operation of the mixer and also a function of the LO swing. Each transistor pair can act as an envelope (power) detector for the LO signal.

In accordance with an embodiment, the mixer can be provided with a replica envelope detector that also receives the LO signal to mirror the envelope detection occurring at the tail transistors. The replica envelope detector, sometimes referred to as a replica bias circuit, can be biased using an operational amplifier and can be coupled to a low pass filter to filter out undesired LO harmonics. Use of such replica envelope detector can be technically advantageous and beneficial by providing a more accurate mirroring of a reference current so that the DC (bias) current of the tail transistors does not vary across PVT and different LO swings. Such mixer circuitry can be included in any type of electronic device 10.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols-sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHZ WLAN band (e.g., from 2400 to 2480 MHz), a 5 GHZ WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network (WPAN) frequency bands such as the 2.4 GHz Bluetooth® band or other WPAN communications bands, cellular telephone frequency bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHZ, near-field communications frequency bands (e.g., at 13.56 MHZ), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
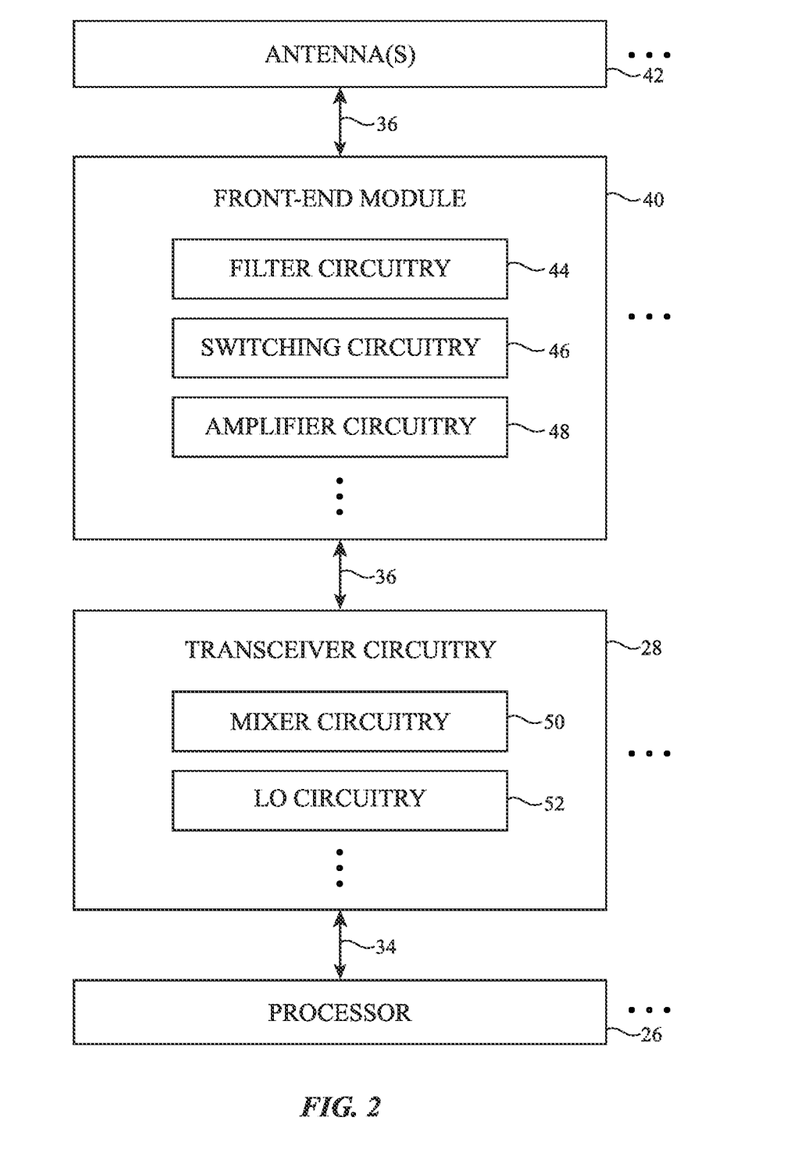
FIG. 2 is a diagram of illustrative wireless circuitry having a transceiver in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be disposed along the radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHZ WLAN band (e.g., from 2400 to 2480 MHZ), a 5 GHZ WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHZ, 3G bands, 4G LTE bands, 5G New Radio Frequency Range 1 (FR1) bands below 10 GHZ, 5G New Radio Frequency Range 2 (FR2) bands between 20 and 60 GHz, etc.), near-field communications (NFC) transceiver circuitry that handles near-field communications bands (e.g., at 13.56 MHZ), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for downconverting (or demodulating) the received radio-frequency signals to baseband frequencies prior to conveying the received signals to processor 26 over path 34. Mixer circuitry 50 can include local oscillator circuitry such as local oscillator (LO) circuitry 52. Local oscillator circuitry 52 can generate oscillator signals that mixer circuitry 50 uses to modulate transmitting signals from baseband frequencies to radio frequencies and/or to demodulate the received signals from radio frequencies to baseband frequencies.

Figure 3:
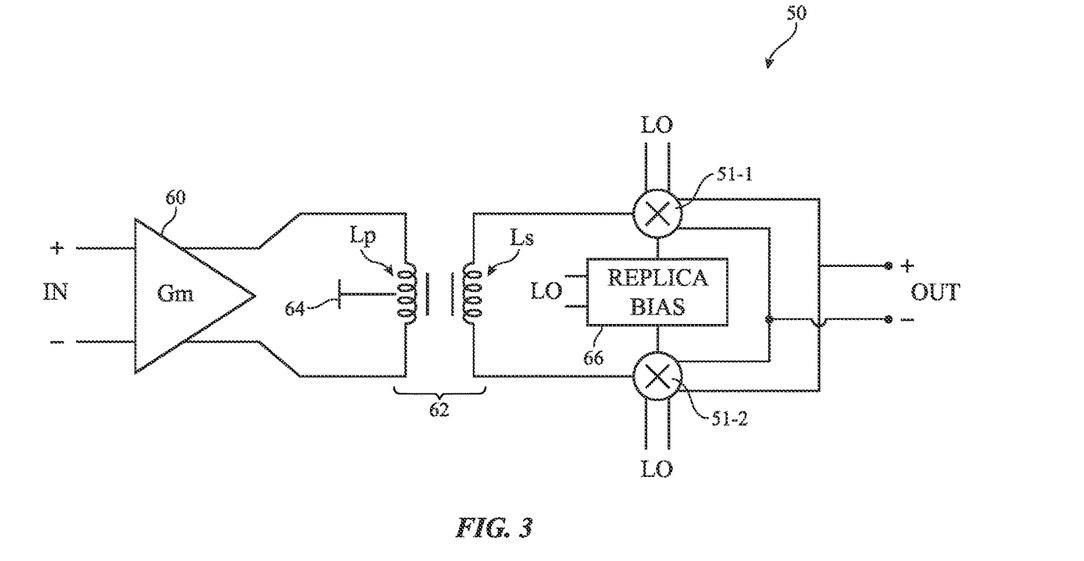
FIG. 3 is a block diagram of illustrative mixer circuitry having a replica bias circuit in accordance with some embodiments.

FIG. 3 is a block diagram of illustrative mixer circuitry 50. As shown in FIG. 3, mixer circuitry 50 may include an input stage such as a transconductance (Gm) circuit 60, a transformer such as transformer 62, and an output stage that includes associated mixer subcircuits 51-1 and 51-2. The pair of mixer subcircuits 51-1 and 51-2 can each include two LO input transistors and is therefore sometimes referred to collectively as a switching quad. Transconductance circuit 60 may be a differential circuit configured to convert an input voltage received at its differential input port IN to a corresponding output current at its differential output port. The use of a transconductance circuit (sometimes referred to as a Gm cell) as the input stage of mixer circuitry 50 is exemplary. If desired, other types of amplifier, buffer, driver, or input stage can be employed. In some embodiments, the transconductance (Gm) cell 60 can be omitted (e.g., the Gm cell 60 is optional).

Transformer 62 may include a first coil (winding) such as primary coil Lp and a second coil (winding) such as secondary coil Ls. Primary coil Lp may have a first terminal coupled to a first output terminal of transconductance circuit 60, a second terminal coupled to a second output terminal of transconductance circuit 60, and a center tap terminal coupled to voltage line 64. The first and second output terminals of circuit 60 may collectively form the differential output port of transconductance circuit 60. Voltage line 64 can receive a positive power supply voltage, a ground power supply voltage, a negative power supply voltage, an intermediate voltage between the positive and ground power supply voltages, or other static (direct current or DC) voltage. Secondary coil Ls may have a first terminal coupled to a first mixer subcircuit 51-1 and a second terminal coupled to a second mixer subcircuit 51-2.

First mixer subcircuit 51-1 of the mixer output stage has a first input coupled to the first terminal of secondary coil Ls, a second input configured to receive an oscillating signal LO from a local oscillator (see, e.g., local oscillator circuitry 52 of FIG. 2), and an output coupled to a differential output port OUT of mixer circuitry 50. Second mixer subcircuit 51-2 of the mixer output stage has a first input coupled to the second terminal of secondary coil Ls, a second input also configured to receive local oscillator signal LO, and an output coupled to the differential output port OUT of mixer circuitry 50.

It can be challenging to design a satisfactory radio-frequency mixer. If care is not taken, mixers can be subject to PVT (process, voltage, and temperature) variations and can result in degradations in the gain, noise figure, and linearity of the mixers.

In accordance with some embodiments, mixer circuitry 50 can be provided with a bias circuit such as bias circuit 66 configured to bias mixer subcircuits 51-1 and 51-2. Bias circuit 66 can also receive the LO signal. Bias circuit 66 has a similar circuit structure as the mixer subcircuits 51, so it is sometimes referred to herein as a "replica" bias circuit 66. Use of replica bias circuit 66 can be technically advantageous and beneficial by ensuring that one or more DC current(s) flowing in mixer circuitry 50 is insensitive to PVT variations and the LO swing, which itself can vary across PVT and frequency.

Figure 4:
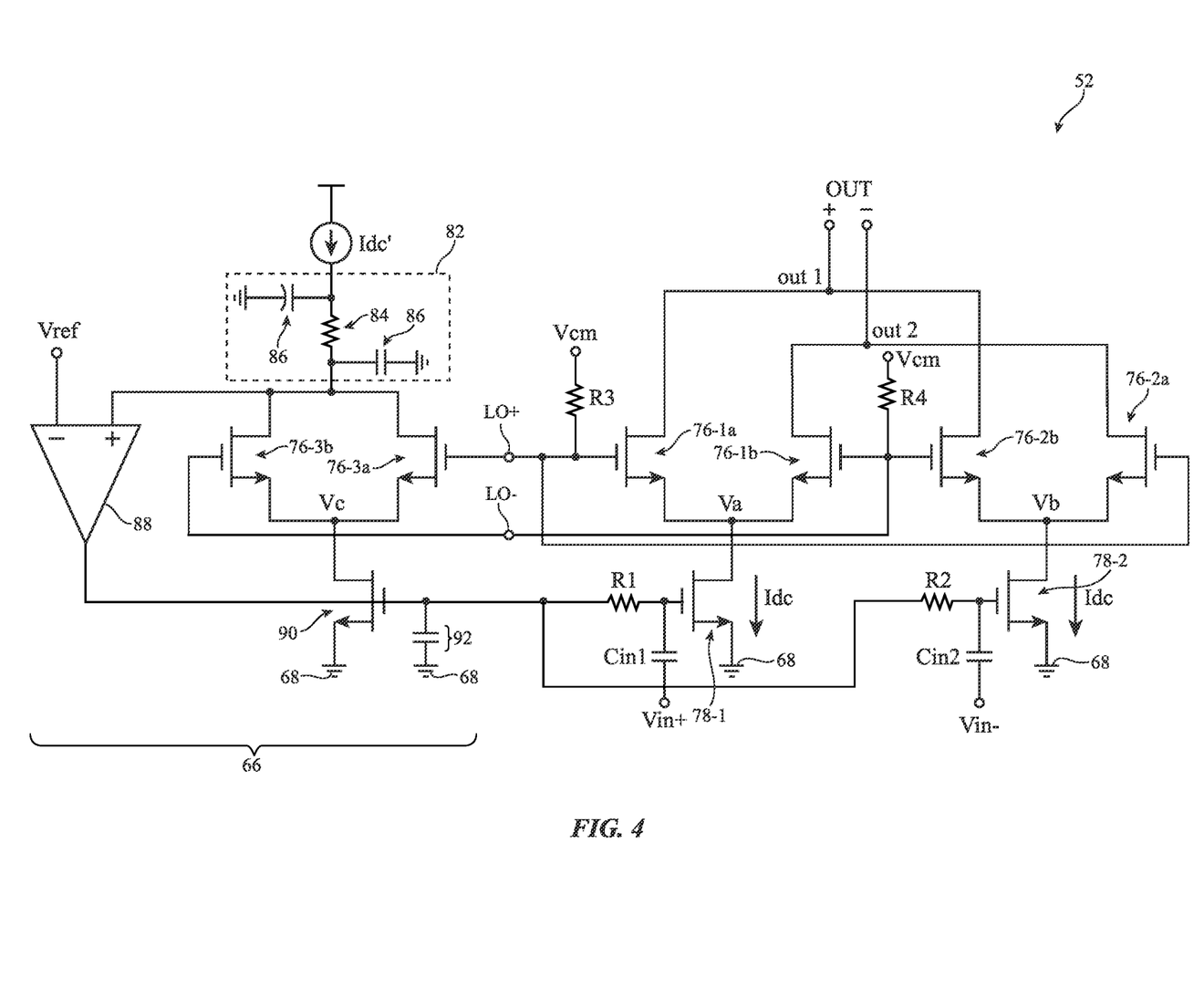
FIG. 4 is a circuit diagram showing one implementation of illustrative mixer circuitry having a replica bias circuit in accordance with some embodiments.

FIG. 4 is a circuit diagram showing one implementation of mixer circuitry 50 that can be provided with a replica bias circuit 66. As shown in FIG. 4, mixer circuitry 50 can include a first input transistor 78-1 and a second input transistor 78-2. Input transistors 78-1 and 78-2 can be n-channel devices such as n-type metal-oxide-semiconductor (NMOS) transistors. Input transistor 78-1 may have a source terminal coupled to a ground power supply line 68 (e.g., a ground line on which a ground voltage is provided), a drain terminal coupled to a first tail node Va, and a gate terminal configured to receive input voltage Vin+ via an input coupling capacitor Cin1. Input transistor 78-2 may have a source terminal coupled to ground line 68, a drain terminal coupled to a first tail node Vb, and a gate terminal configured to receive input voltage Vin− via an input coupling capacitor Cin2. Input voltages Vin+ and Vin− collectively form a differential input voltage for mixer circuitry 50. The terms "source" and "drain" terminals used to refer to current-conveying terminals in a transistor may be used interchangeably and are sometimes referred to as "source-drain" terminals. Thus, the drain terminal of transistor 78-1 can sometimes be referred to as a first source-drain terminal, and the source terminal of transistor 78-1 can be referred to as a second source-drain terminal (or vice versa). Input transistors 78-1 and 78-2 are sometimes referred to as tail transistors. The amount of current flowing through the tail transistors should be similar or identical (e.g., the amount of current flowing through each of transistors 78-1 and 78-2 can be equal to DC current amount Idc).

Mixer circuitry 50 can also include a first pair of mixer transistors 76-1a and 76-1b (sometimes referred to as a first transistor pair) and a second pair of mixer transistors 76-2a and 76-2b (sometimes referred to as a second transistor pair). Mixer transistors 76-1a and 76-1b may be part of first mixer subcircuit 51-1 (see FIG. 3), whereas mixer transistors 76-2a and 76-2b may be part of second mixer subcircuit 51-2. Mixer transistor 76-1a may have a source terminal coupled to the first tail node Va, a gate terminal configured to receive signal LO+, and a drain terminal coupled to a first mixer output port out1. The gate terminal of mixer transistor 76-1a may also be coupled to a common mode voltage Vcm via resistor R3.

Mixer transistor 76-1b may have a source terminal also coupled to the first tail node Va, a gate terminal configured to receive signal LO−, and a drain terminal coupled to a second mixer output port out2. Signals LO+ and LO− represent the positive and negative polarities of a differential oscillating signal and can collectively be referred to as a local oscillator signal or an oscillating signal. The LO or oscillating signal can be generated using local oscillator circuitry 52 of FIG. 2 or using other clock signal generator. The gate terminal of mixer transistor 76-1b may be coupled to common mode voltage Vcm via resistor R4. The gate terminals of mixer transistors 76-1a and 76-1b collectively form a differential input port for receiving the oscillating signal. Output ports out1 and out2 collectively form the differential output port OUT of mixer circuitry 50. An output inductor (not shown) can optionally be coupled across the differential output port of mixer circuitry 50.

Turning to the second mixer pair, mixer transistor 76-2a may have a source terminal coupled to the second tail node Vb, a gate terminal configured to receive signal LO+, and a drain terminal coupled to the second mixer output port out2. Mixer transistor 76-2b may have a source terminal also coupled to the second tail node Vb, a gate terminal configured to receive signal LO−, and a drain terminal coupled to the first mixer output port out1. The gate terminals of mixer transistors 76-2a and 76-2b collectively form a differential input port for receiving the oscillating signal.

Still referring to FIG. 4, bias circuit 66 may include a third pair of mixer transistors 76-3a and 76-3b (sometimes referred to as a third transistor pair), a third tail transistor 90, an amplifier such as operational amplifier 88, and various passive components. Transistor 76-3a may have a source terminal coupled to a third tail node Vc, a gate terminal configured to receive signal LO+, and a drain terminal. Mixer transistor 76-3b may have a source terminal also coupled to the third tail node Vc, a gate terminal configured to receive signal LO−, and a drain terminal shorted to the drain terminal of transistor 76-3a. The gate terminals of transistors 76-3a and 76-3b collectively form a differential input port for receiving the local oscillator signal. Transistors 76-3a and 76-3b are coupled together in parallel.

Tail transistor 90 may have a drain terminal coupled to tail node Vc, a source terminal coupled to ground line 68, and a gate terminal that is coupled to the gate terminal of input transistor 78-1 via series resistor R1 and that is coupled to the gate terminal of input transistor 78-2 via series resistor R2. A shunt capacitor 92 can optionally be coupled at the gate terminal of transistor 90. Operational amplifier 88 (sometimes referred to as an "opamp") may have a first (negative) input configured to receive a reference voltage Vref, a second (positive) input coupled to the drain terminals of transistors 76-3a and 76-3b, and an output coupled to the gate terminal of tail transistor 90. Transistors 76-3a and 76-3b can receive DC current from current source Idc' at their drain terminals.

A filter circuit such as a low pass filter 82 can optionally be coupled to the drain terminals of transistors 76-3a and 76-3b. Filter 82 can be configured to reject unwanted harmonics associated with the LO signals (e.g., to suppress undesired signals at $2*f_{LO}$, at $3*f_{LO}$, at $4*f_{LO}$, and/or other higher order harmonics, where $f_{LO}$ represents the frequency of the LO signal). In the example of FIG. 4, filter 82 can include a series resistor 84 coupled between two shunt capacitors 86 to form a CRC-type filter. This is merely illustrative. In general, filter 82 can include one or more resistors, one or more capacitors, and/or one or more inductors coupled together in any suitable arrangement to provide the desired frequency response.

The combination of mixer transistors 76-1a and 76-1b and any parasitic capacitance at tail node Va functions like an envelope detector (e.g., a power detector) that modifies the drain-to-source voltage ("Vds1") across tail transistor 78-1. Similarly, the combination of mixer transistors 76-2a and 76-2b and any parasitic capacitance at tail node Vb functions like another envelope detector (e.g., a power detector) that modifies the drain-to-source voltage ("Vds2") across tail transistor 78-2. Voltages Vds1 and Vds2 can change as a function of PVT and LO swing variations, which can lead to instability in the Idc flowing through the input transistors 78-1 and 78-2.

Bias circuit 66 is configured to replicate the envelope detection occurring at tail nodes Va and Vb. Bias circuit 66 can have a similar structure as the mixer pairs. For example, both transistors 76-3a and 76-3b in the bias circuit 66 are coupled to a shared tail transistor 90. Transistor 76-3a can be a fraction of the size of transistor 76-1a (e.g., transistor 76-3a can be half the size of mixer transistor 76-1a, a third of the size of mixer transistor 76-1a, a quarter of the size of mixer transistor 76-1a, a fifth of the size of mixer transistor 76-1a, etc.). Similarly, transistor 76-3b can be a fraction of the size of transistor 76-1b (e.g., transistor 76-3b can be half the size of mixer transistor 76-1b, a third of the size of mixer transistor 76-1b, a quarter of the size of mixer transistor 76-1b, a fifth of the size of mixer transistor 76-1b, etc.). Transistors 76-3a and 76-3b can have the same size or can have different sizing. Configured in this way, any variation at node Va and Vb can be replicated at node Vc. Any resulting variation can be sensed or detected by operational amplifier 88, which causes operational amplifier 88 to adjust the corresponding gate voltages of transistors 90, 78-1, and 78-2 to compensate for any unwanted variations (e.g., amplifier 88 can generate an output voltage for adjusting, controlling, or stabilizing the amount of current flowing through the mixer transistors). Operated as such, a more accurate mirroring of the reference current Idc' can be achieved. Transistors 76-3a and 76-3b configured in this way are sometimes referred to and defined herein as "replica bias transistors." Bias circuit 66 is therefore sometimes also referred to as a replica envelope detection circuit or a replica envelope detector.

Figure 5:
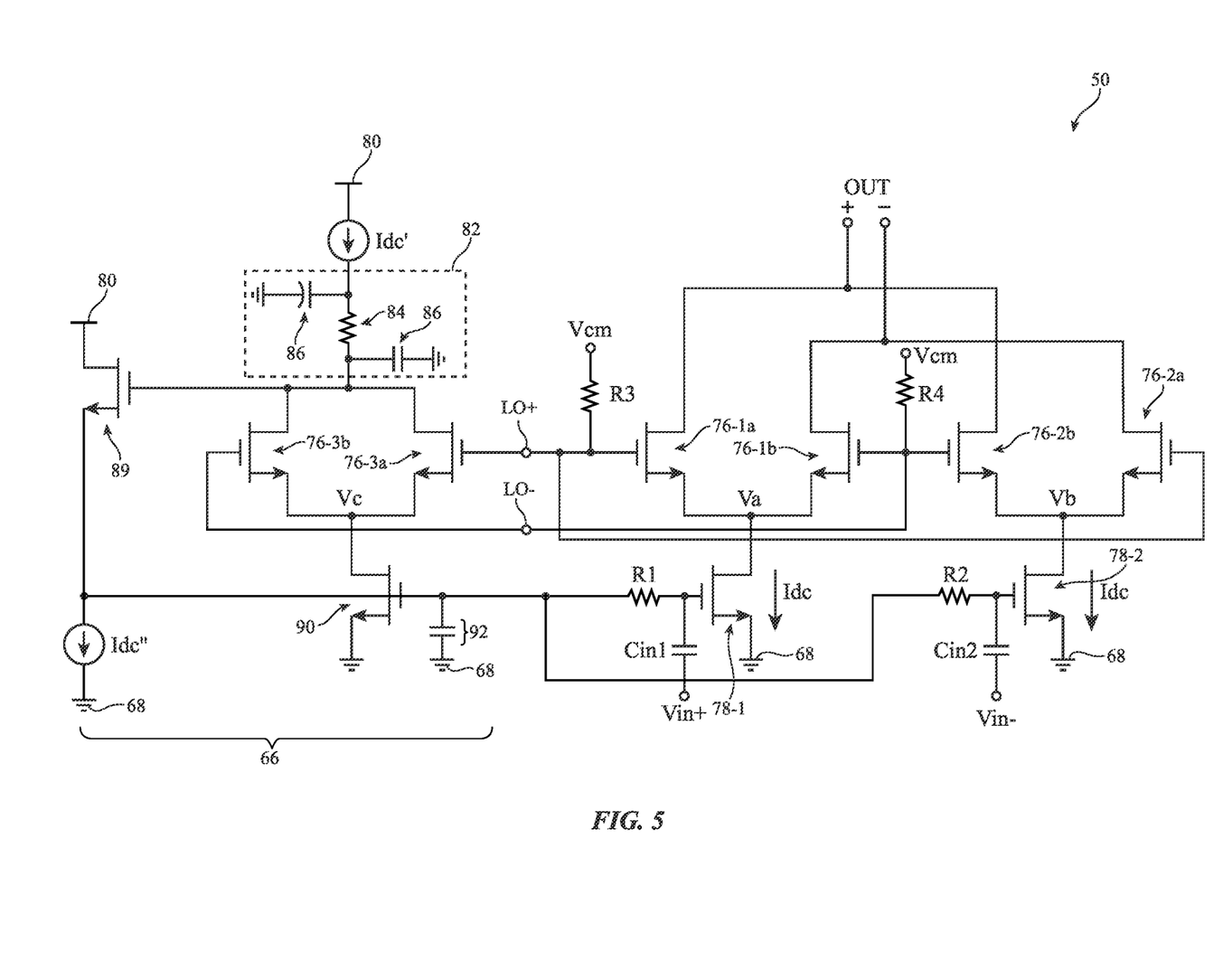
FIG. 5 is a circuit diagram showing another implementation of illustrative mixer circuitry having a replica bias circuit in accordance with some embodiments.

The embodiment of FIG. 4 in which replica bias circuit 66 includes an opamp 88 is exemplary. FIG. 5 shows another example of replica bias circuit 66 implemented without a differential opamp. As shown in FIG. 5, replica bias circuit 66 includes a transistor 89 (e.g., a n-type or NMOS transistor) and a current sink Idc" coupled in series between a positive power supply line 80 and ground line 68. Transistor 89 may have a gate terminal coupled to the drain terminals of bias transistors 76-3a and 76-3b and may have a source terminal coupled to current sink Idc". The node interposed between transistor 89 and current sink Idc" may be coupled to the gate terminal of tail transistor 90. The remaining portion of bias circuit 66 and mixer circuitry 50 has identical structure and function as that already described in connection with FIG. 4 and need not be reiterated in detail to avoid obscuring the present embodiment.

Figure 6:
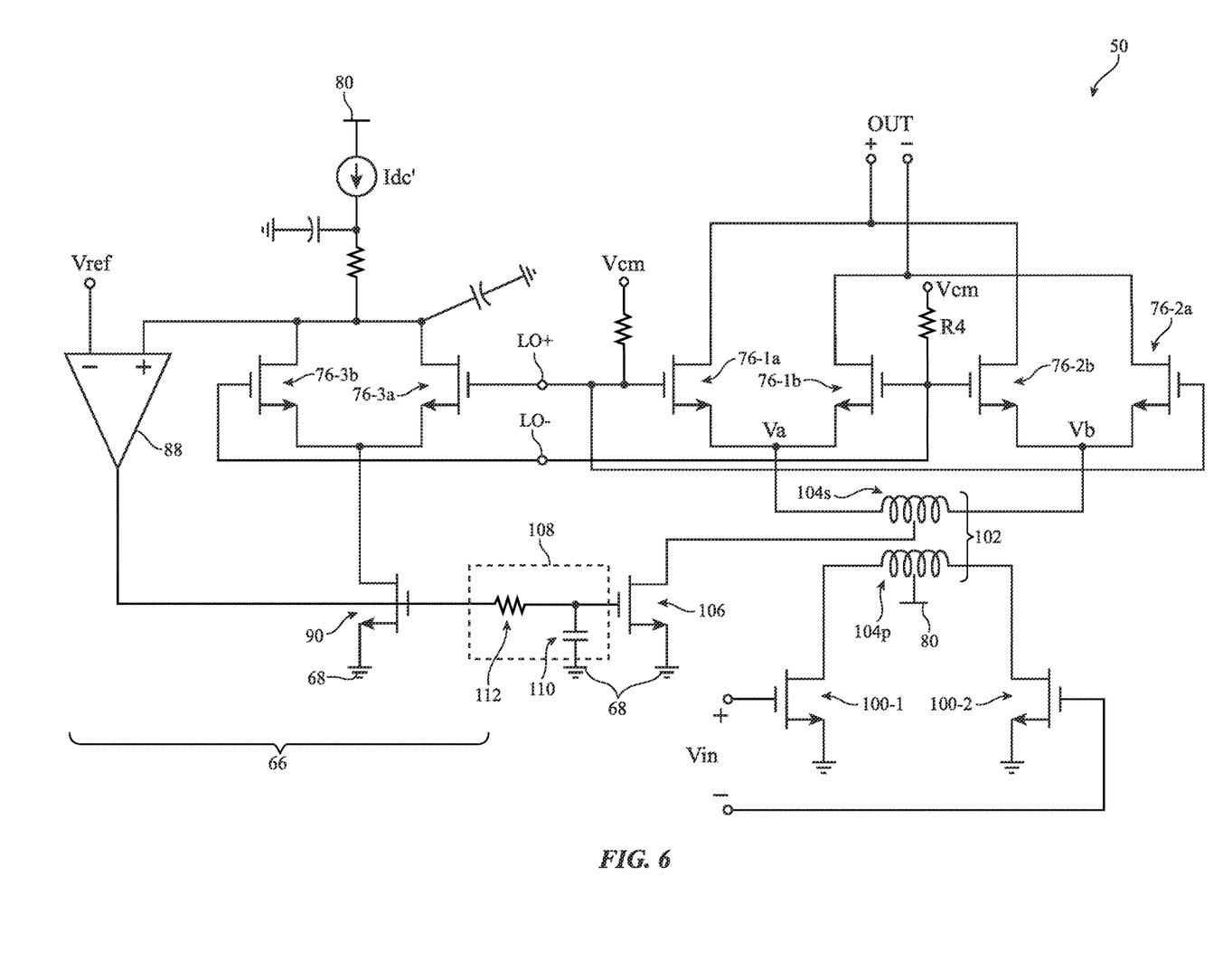
FIG. 6 is a circuit diagram showing another implementation of illustrative mixer circuitry having a replica bias circuit in accordance with some embodiments.

The embodiment of FIGS. 4 and 5 in which the input transistors 78-1 and 78-2 are directly coupled to the tail nodes Va and Vb are illustrative. FIG. 6 shows another embodiment of mixer circuitry 50 having an input transformer interposed between the input transistors and the mixer pairs. Use of a transformer in a mixer can provide a larger voltage headroom for an input stage within the mixer and can provide additional passive current gain from the transformer itself. Since the transformer can decouple the input stage (input portion) from an output stage (output portion) of the mixer, use of the transformer can provide enhanced flexibility in terms of biasing the different portions of the mixer (e.g., the input stage of the mixer can be biased using a first set of bias voltages, whereas the output stage of the mixer can be biased using a second set of bias voltages). A radio-frequency mixer that includes such type of transformer is sometimes referred to and defined herein as a transformer-based mixer.

As shown in FIG. 6, mixer circuitry 50 may include a transformer such as transformer 62 having a primary coil (winding) 104p and a secondary coil (winding) 104s. Primary coil 104p may have a first terminal coupled a first input transistor 100-1, a second terminal coupled to a second input transistor 100-2, and a center tap terminal coupled to positive power supply line 80. In other embodiments, the center tap terminal of coil 104p might be coupled to a ground power supply line or other static voltage line. Input transistors 100-1 and 100-2 can be n-channel devices such as n-type metal-oxide-semiconductor (NMOS) transistors.

Input transistor 100-1 may have a source terminal coupled to ground power supply line 68, a drain terminal coupled to coil 104p, and a gate terminal configured to receive input voltage Vin+. Input transistor 100-2 may have a source terminal coupled to ground line 68, a drain terminal coupled to coil 104p, and a gate terminal configured to receive input voltage Vin−. Input voltages Vin+ and Vin− collectively form a differential input voltage Vin (e.g., a radio-frequency input signal, an analog AC signal, an intermediate frequency signal, an analog baseband signal, etc.) for mixer circuitry 50. The amount of current flowing through the input transistors should be similar or identical.

Secondary coil 104s may have a first terminal coupled to first tail node Va, a second terminal coupled to second tail node Vb, and a center tap terminal coupled to transistor 106. Transistor 106 (e.g., an n-type or NMOS transistor) may have a drain terminal coupled to the center tap terminal of secondary coil 104s, a source terminal coupled to ground line 68, and a gate terminal coupled to the gate terminal of tail transistor 90 of the replica bias circuit 66. A filter circuit such as a low pass filter 108 can optionally be coupled to gate terminals of transistors 90 and 106. Transistor 106 may also be referred to herein as a bias transistor. Filter 108 can be configured to reject unwanted harmonics or distortion signals associated with the LO signals. In the example of FIG. 6, filter 108 can include a series resistor 112 coupled to a shunt capacitor 110 to form an RC-type filter. This is merely illustrative. In general, filter 108 can include one or more resistors, one or more capacitors, and/or one or more inductors coupled together in any suitable arrangement to provide the desired frequency selection. The remaining portion of bias circuit 66 and mixer circuitry 50 in FIG. 6 has identical structure and function as that already described in connection with FIG. 4 and need not be reiterated in detail to avoid obscuring the present embodiment.

Figure 7:
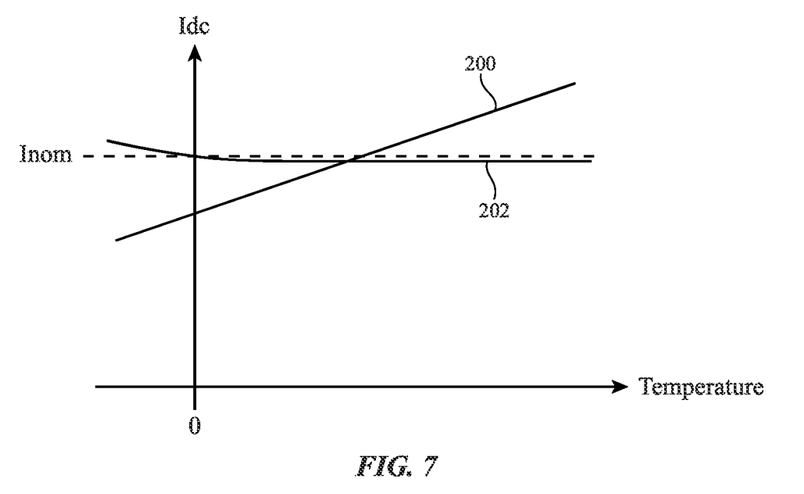
FIG. 7 is plot of a DC (direct current) current level in mixer circuitry of the type shown in FIGS. 3-6 as a function of temperature in accordance with some embodiments.

FIG. 7 is plot of a DC current level Idc (e.g., the current flowing through the input transistors) in mixer circuitry 50 of the type shown in FIGS. 3-6 as a function of temperature. Line 200 represents the tail current Idc as a function of temperature for a mixer without replica bias circuit 66. Line 202 represents the tail current Idc as a function of temperature for mixer circuitry 50 having replica bias circuit (replica envelope detector) 66. As shown in FIG. 7, line 200 can deviate by some amount from the nominal DC current level Inom, whereas line 202 deviates much less from Inom. In other words, use of replica bias circuit 66 can help ensure that Idc is more insensitive to PVT variations.

Figure 8:
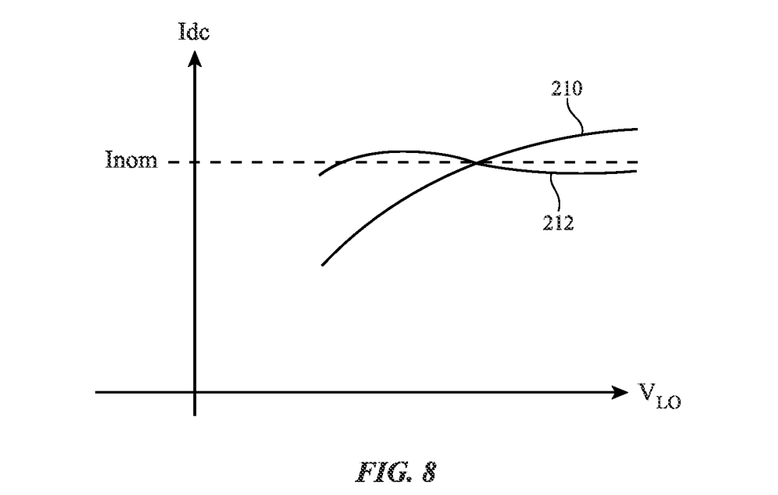
FIG. 8 is a plot of a DC current level in mixer circuitry of the type shown in FIGS. 3-6 as a function of LO (local oscillator) signal amplitude in accordance with some embodiments.

FIG. 8 is plot of a DC current level Idc (e.g., the current flowing through the input transistors) in mixer circuitry 50 of the type shown in FIGS. 3-6 as a function of LO swing (e.g., the amplitude of the LO signal $V_{LO}$). Line 210 represents the tail current Idc as a function of $V_{LO}$ for a mixer without replica bias circuit 66. Line 212 represents the tail current Idc as a function of $V_{LO}$ for mixer circuitry 50 having replica bias circuit (replica envelope detector) 66. As shown in FIG. 8, line 210 can deviate by some amount from the nominal DC current level Inom, whereas line 212 deviates much less from Inom. In other words, use of replica bias circuit 66 can help ensure that Idc is more insensitive to swings in the LO signal.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

What is claimed is:

1. Mixer circuitry comprising:
a first mixer transistor configured to receive a first oscillating signal;
a second mixer transistor configured to receive a second oscillating signal different than the first oscillating signal;
a first bias transistor configured to receive the first oscillating signal and having source and drain terminals; and
a second bias transistor configured to receive the second oscillating signal and having a drain terminal coupled to the drain terminal of the first bias transistor and a source terminal coupled to the source terminal of the first bias transistor.

2. The mixer circuitry of claim 1, further comprising:
a third mixer transistor configured to receive the first oscillating signal; and
a fourth mixer transistor configured to receive the second oscillating signal.

3. The mixer circuitry of claim 2, wherein:
the first mixer transistor has a source terminal coupled to a first tail node; and
the second mixer transistor has a source terminal coupled to the first tail node.

4. The mixer circuitry of claim 3, wherein:
the third mixer transistor has a source terminal coupled to a second tail node; and
the fourth mixer transistor has a source terminal coupled to the second tail node.

5. The mixer circuitry of claim 4, wherein:
the first mixer transistor has a drain terminal coupled to a first output port;
the second mixer transistor has a drain terminal coupled to a second output port;
the third mixer transistor has a drain terminal coupled to the second output port; and
the fourth mixer transistor has a drain terminal coupled to the first output port.

6. The mixer circuitry of claim 4, further comprising:
a transformer with a secondary coil having a first terminal coupled to the first tail node and having a second terminal coupled to the second tail node.

7. The mixer circuitry of claim 6, further comprising:
a first input transistor configured to receive an input signal and coupled to a primary coil in the transformer; and
a second input transistor configured to receive the input signal and coupled to the primary coil.

8. The mixer circuitry of claim 6, further comprising:
a tail transistor having a drain terminal coupled to the source terminal of the first bias transistor and to the source terminal of the second bias transistor.

9. The mixer circuitry of claim 8, further comprising:
an operational amplifier having a first input configured to receive a reference voltage, a second input coupled to the drain terminal of the first bias transistor, and an output coupled to a gate terminal of the tail transistor.

10. The mixer circuitry of claim 8, further comprising:
a third bias transistor having a gate terminal coupled to a gate terminal of the tail transistor and having a drain terminal coupled to a center tap terminal of the secondary coil.

11. The mixer circuitry of claim 8, further comprising:
a filter circuit coupled directly to the gate terminal of the tail transistor.

12. The mixer circuitry of claim 1, further comprising:
a current source coupled to the drain terminals of the first and second bias transistors.

13. The mixer circuitry of claim 12, further comprising:
a filter circuit coupled directly to the drain terminals of the first and second bias transistors.

14. Mixer circuitry comprising:
a first pair of mixer transistors configured to receive an oscillating signal;
a second pair of mixer transistors configured to receive the oscillating signal; and
a bias circuit configured to receive the oscillating signal and to generate a corresponding output voltage for controlling an amount of current flowing through the first and second pairs of mixer transistors.

15. The mixer circuitry of claim 14, further comprising:
a first input transistor coupled to the first pair of mixer transistors at a first tail node; and
a second input transistor coupled to the second pair of mixer transistors at a second tail node.

16. The mixer circuitry of claim 15, wherein the bias circuit further comprises:
a pair of bias transistors coupled together in parallel and configured to receive the oscillating signal.

17. The mixer circuitry of claim 16, wherein the bias circuit further comprises:
a current source coupled to drain terminals of the pair of bias transistors; and
a tail transistor coupled to source terminals of the pair of bias transistors.

18. The mixer circuitry of claim 17, wherein the bias circuit further comprises:
an operational amplifier having a first input configured to receive a reference voltage, a second input coupled to the drain terminal of the pair of bias transistors, and an output coupled to a gate terminal of the tail transistor.

19. Mixer circuitry comprising:
first and second mixer transistors configured to receive a differential oscillating signal;
third and fourth mixer transistors configured to receive the differential oscillating signal; and
an envelope detection circuit configured to
receive the differential oscillating signal, and
generate an output voltage for controlling an amount of current flowing through at least the first and second mixer transistors.

20. The mixer circuitry of claim 19, wherein the envelope detection circuit comprises:
first and second bias transistors coupled in parallel; and
a tail transistor having a source-drain terminal coupled to the first and second bias transistors and having a gate terminal configured to receive the output voltage of the envelope detection circuit.

* * * * *

UNITED STATES PATENT AND TRADEMARK OFFICE
CERTIFICATE OF CORRECTION

PATENT NO. : 12,206,362 B2
APPLICATION NO. : 18/336761
DATED : January 21, 2025
INVENTOR(S) : Milad Darvishi and Haowei Jiang Page 1 of 1

It is certified that error appears in the above-identified patent and that said Letters Patent is hereby corrected as shown below:

In the Claims

Column 14, Line 51, "the gate terminal" should read -- a gate terminal --

Signed and Sealed this
Thirteenth Day of May, 2025

Coke Morgan Stewart
*Acting Director of the United States Patent and Trademark Office*